United States Patent [19]
Hara et al.

[11] Patent Number: 4,719,140
[45] Date of Patent: Jan. 12, 1988

[54] ELECTRONIC MEMORY CARD

[75] Inventors: Kazuya Hara; Kenji Rikuna, both of Tokyo, Japan

[73] Assignee: Casio Computer Co., Ltd., Tokyo, Japan

[21] Appl. No.: 935,605

[22] Filed: Dec. 1, 1986

Related U.S. Application Data

[63] Continuation of Ser. No. 782,865, Oct. 2, 1985, abandoned.

[30] Foreign Application Priority Data

Nov. 5, 1984 [JP] Japan .................. 59-232834

[51] Int. Cl.⁴ .................. B32B 3/10; G06K 19/06
[52] U.S. Cl. .................. 428/138; 428/67;
428/137; 235/488; 235/492; 283/83; 283/904
[58] Field of Search ........... 428/67, 137, 138, 916;
283/83, 904; 235/488, 492

[56] References Cited

U.S. PATENT DOCUMENTS

| | | | |
|---|---|---|---|
| 4,222,516 | 9/1980 | Badet et al. | 235/492 |
| 4,447,716 | 5/1984 | Aigo | 235/492 |
| 4,483,067 | 11/1984 | Parmentier | 283/904 X |

Primary Examiner—Alexander S. Thomas
Attorney, Agent, or Firm—Frishauf, Holtz, Goodman & Woodward

[57] ABSTRACT

An IC card is disclosed, which comprises an IC pellet electrically connected to lead patterns via an anisotropically conductive adhesive layer. The IC pellet is also bonded to a print layer formed on an insulating film. A base sheet and another insulating film are laminated on the insulating film with the IC pellet sealed by resin in an IC pellet accommodation space formed in the base sheet.

8 Claims, 8 Drawing Figures

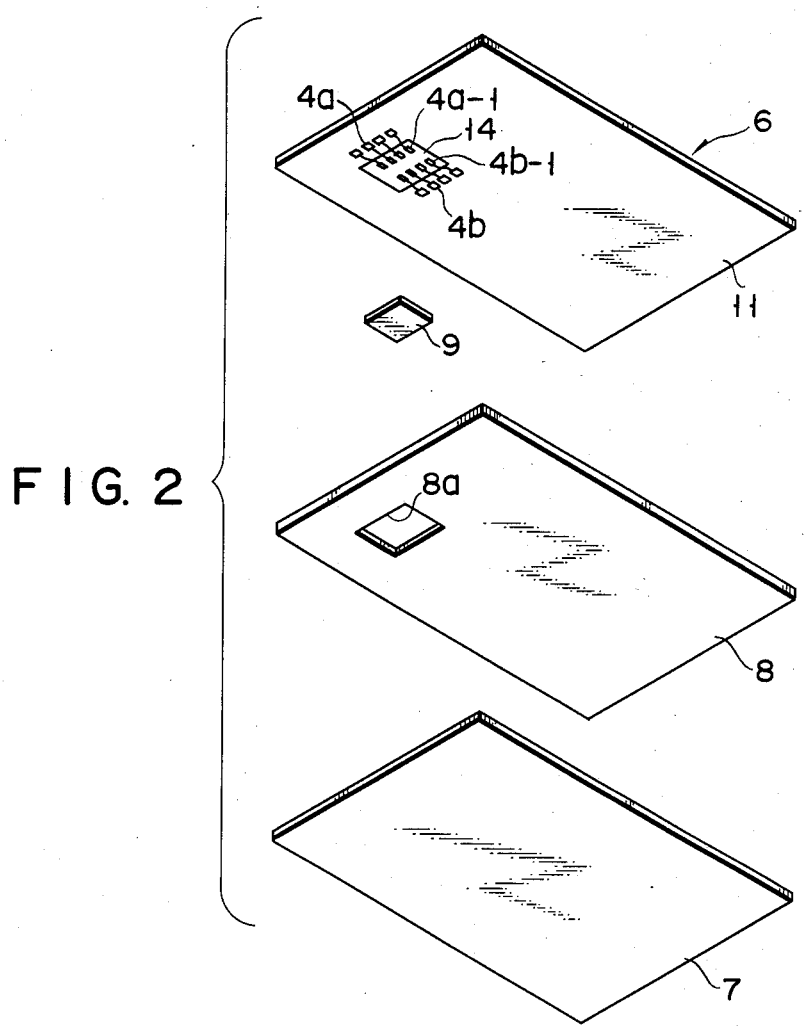

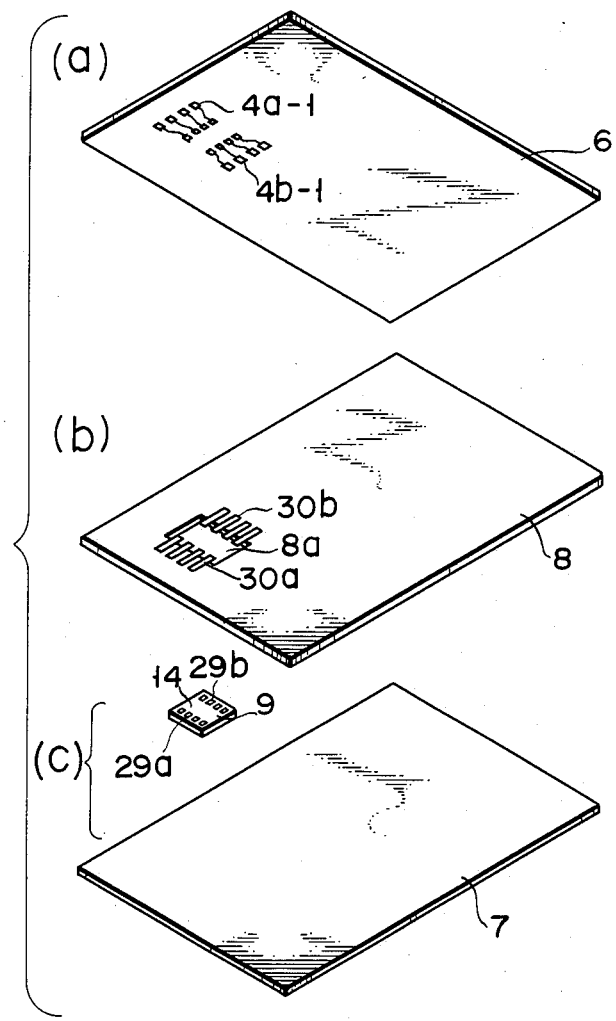
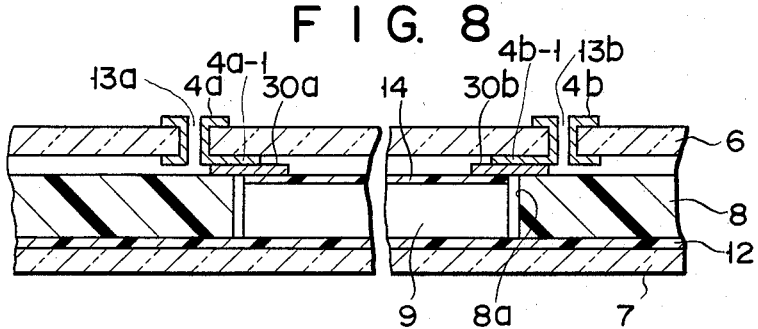

ELECTRONIC MEMORY CARD

This application is a continuation of application Ser. No. 782,865, filed 10/02/85 abandoned.

BACKGROUND OF THE INVENTION

This invention relates to an IC card accommodating an integrated circuit ("IC" hereafter) pellet.

In IC cards, unlike magnetic cards, secret data such as card holder's identification data and personal account number data is stored in a memory in an internal IC pellet, it being almost impossible to unfairly read out such data. For this reason, there is an increasing trend for using IC cards in lieu of magnetic cards.

In the prior art IC card, an IC pellet having a memory is mounted on a printed circuit board (PCB) substrate. The PCB substrate is accommodated in a recess of a base member which serves as a casing member and is in turn enclosed in an overcoat. The IC card is very thin; its thickness is 0.8 mm. The PCB substrate, base member and overcoat, these being components of the IC card, are made of soft plastic materials, while the IC pellet has a rigid body. Therefore, when the IC card is carried in a trousers' hip pocket or the like, it is liable that the IC pellet cannot follow the flexing of the IC card body so that it will detach therefrom. In addition, the IC card body rather comprises a large number of components, requiring a large number of steps for assembly and leading to a cost increase.

SUMMARY OF THE INVENTION

An object of the invention is to provide an IC card, the body of which comprises a smaller number of components to facilitate the manufacture, and also in which the IC pellet does not detach from the body components.

According to the invention, there is provided an IC card, which comprises a base sheet having an IC pellet accomodation space, at least one IC pellet having a plurality of electrode terminals and accommodated in the accommodation space, an insulating film having terminal contacts and bonded to the IC pellet and base sheet, and electric conductive means provided between the electrode terminals and the terminal contacts.

BRIEF DESCRIPTION OF THE DRAWINGS

FIG. 2 is an exploded perspective view of the IC card shown in FIG. 1;

FIG. 7 is an exploded perspective view of a further embodiment of the IC card; and FIG. 8 is a sectional view of the IC card shown in FIG. 7.

DETAILED DESCRIPTION OF THE PREFERRED EMBODIMENTS

Preferred embodiments of the invention will now be described in detail with reference to the drawings. The following embodiments of the IC card are those accommodating an IC pellet and having a magnetic stripe forced on the surface and also card holder's personal account number or the like embossed on the surface of the IC card. However, these IC cards are of course not limitative, and the invention is applicable to any IC card accommodating an IC pellet.

Figure 1:
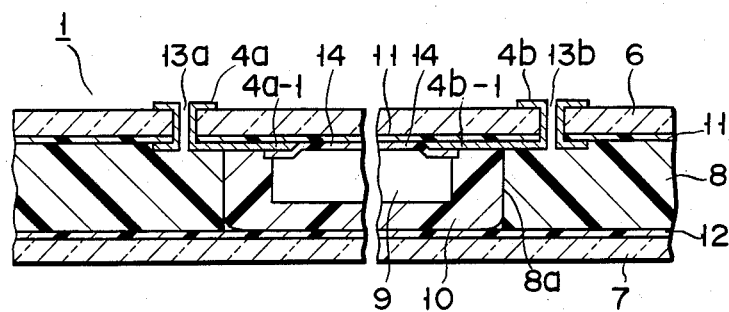
FIG. 1 is a sectional view along line A—A in FIG. 3 showihg the internal structure of an embodiment of the IC card according to the invention.
Figure 3:
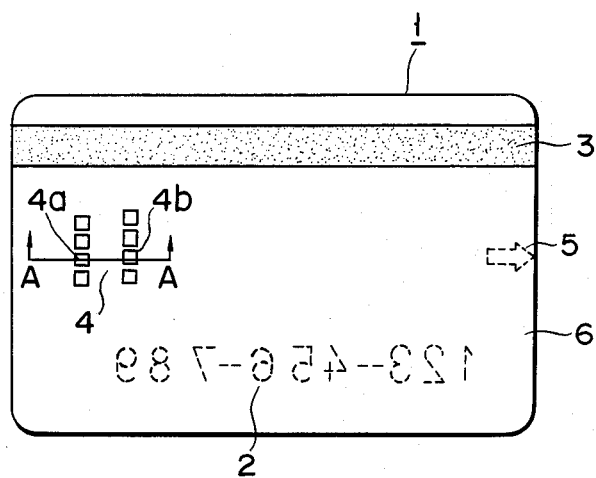
FIG. 3 is a plan view of the IC card shown in FIG. 1.

Referring now to FIGS. 1 to 3, there is shown an embodiment of the invention. The illustrated IC card 1 comprises two insulating films 6 and 7 made of a soft transparent plastic material, e.g., polyvinyl chloride (PVC), and a base sheet 8 of hard PVC or the like and having an IC pellet accommodation through hole 8a. The insulating films 6 and 7 and base sheet 8 are bonded to one another with the base sheet sandwiched between the insulating films 6 and 7. The insulating films 6 and 7 constitute an overcoat of the IC card 1. The insulating film 6 has a magnetic stripe 3 formed on the outer surface along one longitudinal edge thereof. An input/output terminal section 4 is also formed on the same surface. The input/output section 4 consists of eight terminal contacts 4a, 4b arranged in two rows each of four terminal contacts. A personal account number of the holder of the IC card 1 is embossed on the outer surface of the other insulating film 7. Also, an arrow mark 5 indicating the direction of insertion of the IC card 1 into an identification terminal device, is also provided on the same surface. The sectional view of FIG. 1 shows a portion taken along line A—A in FIG. 3.

The position of the insertion arrow mark 5 and the position of the input/output terminal section 4 in the IC card 1 are determined in conformity to a standards proposal of the International Standards Organization (ISO).

The eight terminal contacts of the input/output terminal section 4 are used for the input and output of address data, for a clock signal, for a reset signal, for a power supply, for grounding and for a power supply which is used only when data is written in an EP-ROM provided in the IC pellet. These terminal contacts are made from a gold-plated copper foil.

Referring back to FIG. 1, on the inner surface of the transparent insulating film 6 is provided a print layer 11 bearing such information as a bank name or a credit company name and ornamental patterns or the like, if desired. A similar print layer 12 is also provided on the inner surface of the transparent insulating film 7. The transparent insulating film 6 and print layer 11 is formed with see-through holes 13a and 13b. Outer terminal contacts 4a and 4b are formed on the outer surface of the film 6 and one end of lead conductors 4a-1, 4b-1 are passed through the see-through holes 13a and 13b and connected to the contacts 4a and 4b. The other end of the lead conductors 4a-1, 4b-1 are formed along the print layer 11 and connected to electrode terminals (not shown) of the IC pellet 9. These outer terminal contacts 4a, 4b, through holes 13a, 13b and lead conductors 4a-1, 4b-1 may be formed by using a known method such as plating and etching. When conductive materials of Cu, Al, Ni, which are poor in oxidization-proof property, are used, coating layers should be formed on the conductive plates.

The IC pellet 9 is sealed in the accommodation hole 8a by an insulating IC pellet seal resin. The surface of the IC pellet 9 where electrodes (not shown) are provided is entirely covered by an anisotropically conductive adhesive layer 14. As shown in FIG. 2, an anisotropically conductive adhesive pattern 14, with a thickness of about 30 $\mu$m for instance, is formed by printing on a portion of the print layer 11 formed on the inner side of the insulating film 6 that is to be bonded to the IC pellet 9 inclusive of the lead conductors 4a-1 and 4b-1, i.e., such as to cover all the lead conductors connected to the eight terminal contacts.

The anisotropically conductive adhesive layer 14 is made of a material, which is prepared by adding carbon particles or metal particles to a hot melt type insulating resin having a melting temperature of 120° to 130° C. In its normal state without any pressure applied to it, it is electrically insulating in any direction, i.e., in the direction of the thickness and in the direction along the surface. However, when a pressure is applied to its portion corresponding to the terminal section of the IC pellet 9 in its thickness direction from above the lead patterns 4a-1 and 4b-1 at a temperature of about 130° C., the insulating region is melted and the conductive particles of carbon particles or metal particles dispersed in the adhesive layer 14 will be disclosed at both sides of the layer 14 with a reduction of the thickness of the layer 14. Consequently, the layer 14 becomes conductive only in the thickness direction. Thus, of the adhesive layer 14 in contact with the lead conductors 4a-1 and 4b-1 only the portion corresponding to the terminal section of the IC pellet 9 is rendered conductive, that is, the terminal contacts 4a and 4b are electrically connected to the terminal section of the IC pellet 9. At the same time, the IC pellet 9 is secured to the insulating film 6 via the print layer 11.

Subsequently, the insulating film 6 with the IC pellet 9 and base sheet 8 are laminated by positioning these components such that the IC pellet 9 is accommodated in the IC pellet accommodation hole 8a formed in the base sheet 8. The accommodation hole 8a is filled with a resin 10 to protect the IC pellet 9. Then, the film 7 is bonded to the base sheet 8, while sealing the IC pellet 9 in the accommodation hole 8a. The magnetic stripe 3 is coated on the film 6 and an emboss 2 is formed on the surface of film 7 to represent personal account number.

The IC card 1 thus fablicated as shown in FIG. 1 has a thickness of 0.8 mm, a long side dimension of 85.5 mm and a short side dimension of 54 mm. In this IC card 1, unlike the prior art one, the IC pellet 9 is directly secured to the insulating film 6 as the overcoat without agency of any IC pellet base member and is sealed in the accommodation space 8a of the base sheet 8 by the resin 10. The IC pellet 9 thus is firmly held in the accommodation space 8a, and also the IC card can be assembled more easily.

Figure 4:
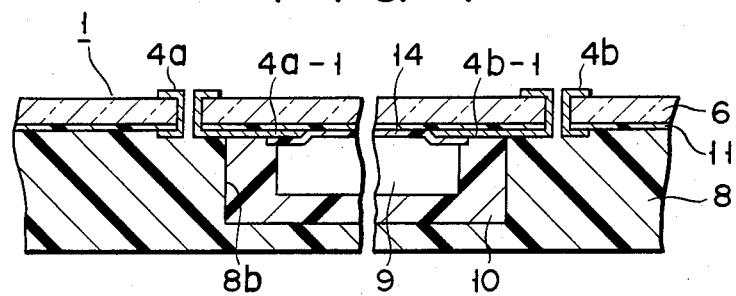
FIG. 4 is a sectional view showing the internal construction of a modification of the embodiment shown in FIG. 1.

In the above embodiment, the IC pellet 9 is accommodated in the accommodation hole 8a of the base sheet 8 and sandwiched between the insulating films 6 and 7. In a modification shown in FIG. 4, the IC pellet 9 is accommodated in a recess 8b, which is formed in the base sheet 8 on the side thereof in contact with the insulating film 6. In this instance, the IC pellet 9 is bonded via the anisotropically conductive adhesive layer 14 to the print layer 11 on the insulating film 6 as in the preceding embodiment of FIG. 1. The film 6 with the IC pellet 9 and base sheet 8 are then laminated by positioning them such that the IC pellet 9 is accommodated in the recess 8b, while sealing the IC pellet 9 with the resin 10, thus completing the IC card 1. This construction is simpler than the embodiment of FIG. 1 because it does not comprise the insulating film 7 (FIG. 1), so that it can be fablicated more easily. In the embodiment of FIG. 1 the outer surface of the insulating film 7 is provided with the emboss 2. In the instance of FIG. 4, such emboss may be provided on the outer surface of the base sheet 8.

Figure 5:
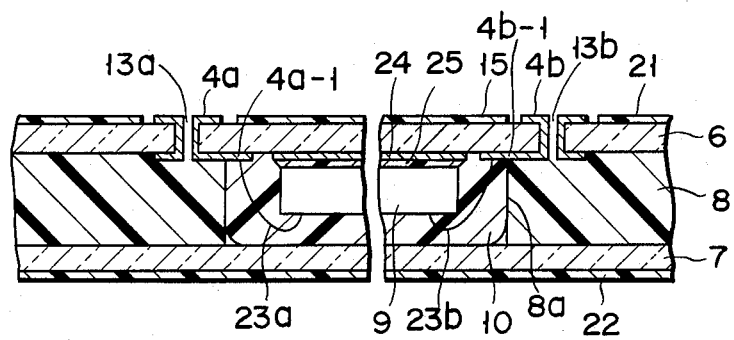
FIGS. 5 and 6 are sectional views showing different embodiments of the IC card according to the invention.

FIG. 5 shows a different modification of the embodiment of FIG. 1. In this instance, unlike the embodiment of FIG. 1, the print layers 21 and 22 are formed on the outer surface of the respective insulating films 6 and 7, i.e., on the outer surfaces of the IC card. In addition, the lead conductors 4a-1 and 4b-1 are connected to the terminal section of the IC pellet 9 by gold bonding wires 23a and 23b. Further, the IC pellet 9 is die-bonded by an adhesive layer 25 to a copper sheet 24 secured to the insulating film 6. It is to be understood, therefore, the feature of the embodiment of FIG. 5 is that the insulating films 6 and 7 need not be made of transparent material. The rest of the construction is the same as in the embodiment of FIG. 1, except for the fact that the IC pellet 9 is die-bonded to the copper sheet 24 and both ends of the wires 23a, 23b are bonded to the electrodes of the IC pellet 9 and the lead conductors 4a-1 and 4b-1.

The connection of the gold bonding wires 23a and 23b to the terminal section of the IC pellet 9 and also to the lead conductors 4a-1 and 4b-1, may be done by a wire bonding process through pulse heating. To facilitate this bonding, the lead conductors 4a-1 and 4b-1 are made from a tin-plated copper foil. The copper sheet 24 is used as a reinforcement member in order to prevent the IC pellet 9 from being directly influenced by the deformation of the insulating film 6 of soft PVC.

Figure 6:
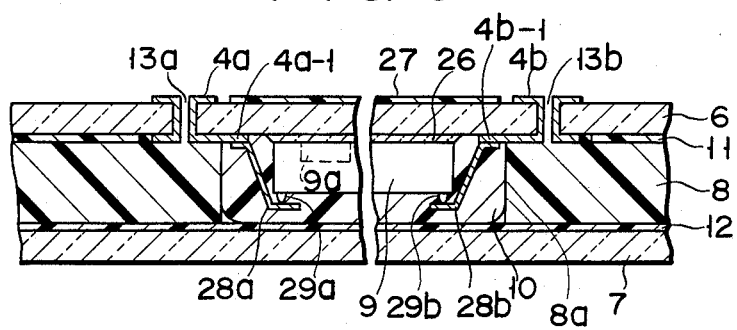

FIG. 6 shows a further modification. In this instance, the IC pellet 9 is bonded via a transparent adhesive layer 26 to the inner surface of the insulating film 6. In this case, an EP-ROM (erasable and programmable read-only-memory) 9a provided in the IC pellet 9 is disposed at a position in contact with the adhesive layer 26. The EP-ROM 9a is of such type that its memory contact can be erased by ultraviolet rays.

In order to prevent the stored content from being occasionally erased, an opaque seal 27, made from a polyester film with a thickness of 20 $\mu$m for instance, is provided on a portion of the outer surface of the insulating film 6 corresponding to the IC pellet 9. The seal 27 can be removed when erasing the stored content.

Metal tapes 28a and 28b are connected at one end to the lead conductors 4a-1 and 4b-1, and their other end is connected by bonding to terminals 29a and 29b of the IC pellet 9. In this method of connection Tape Automated Bonding method can be used. After the bonding, the IC pellet 9 is again sealed with the resin 10.

FIGS. 7 and 8 show still further embodiment of this invention, in which the IC pellet 9 is held in the accommodation hole 8a formed in the base sheet 8. The feature of this embodiment is that lead conductors 30a and 30b are formed on one surface of the base sheet 8 with one end thereof projecting from side edges of the accommodation hole 8a.

Referring to FIGS. 7 and 8, an insulation film 6 is provided with through holes 13a and 13b and at the outer surface of the film is provided with external terminal contacts 4a and 4b. As shown in (a) in FIG. 7, lead conductors 4a-1 and 4b-1 are formed at inner surface of the film 6 continuous to the contacts 4a and 4b extended into the through holes 13a and 13b.

When the lead conductors 30a and 30b are formed, a copper foil is first laminated on the base sheet 8 to cover the hole 8a. The copper foil is then etched to form the lead conductors 30a and 30b with one end of each of conductors 30a and 30b projected into the hole 8a, as shown in (b) in FIG. 7.

As shown in (c) in FIG. 7, one surface of an IC pellet 9, which is provided with IC terminals 29a, 29b, is coated with anisotropically conductive adhesive layer 14. The IC pellet 9 is pressed onto the lead conductors 30a and 30b under the temperature of 130° C., for example. As a result, the terminals 29a, 29b are connected to the lead conductors 30a, 30b and the IC pellet 9 is secured on the lead conductors 30a and 30b with the IC pellet 9 enclosed in the hole 8a of the base sheet 8. The insulating region films 6 and 7, base sheet 8 and print film 12 are laminated together and lead conductors 4a-1, 4b-1 are connected to the lead conductors 30a to 30b.

As has been described in the foregoing, according to the invention an insulating film used as an overcoat of an IC card is provided with outer lead terminals and then the insulating film is bonded to a base sheet with an IC pellet accommodation space wherein the IC pellet is held. Thus, there is no need of using any IC pellet mounting base member. Thus, the fablication can be simplified. In addition, the reduction of the number of components permits cost reduction. Further, the IC pellet can be firmly mounted in the base sheet.

What is claimed is:

1. An electronic memory card comprising:
 a base sheet having a predetermined surface including an accomodation space sized for receiving an integrated semiconductor circuit pellet;
 first electric conductive means which is formed on one surface of said base sheet and includes a plurality of first conductive leads each having a portion extended into said accomodation space formed in said base sheet;
 at least one integrated semiconductor circuit pellet seated in said accomodation space and having a plurality of electrode terminals each of which is connected to a corresponding one of said plurality of first conductive leads;
 an insulating film having substantially the same size of surface area as said base sheet and including a plurality of holes receiving therein input/output terminals, respectively, said insulating film including removable opaque means secured in a portion opposed to said Erasable and Programmable Read Only Memory for blocking light thereto;
 second electric conductive means which is formed on an inner side of said insulating film and includes second conductive leads each having one end in contact with said corresponding first conductive lead and the other end extended into each of said plurality of holes.

2. An electronic memory card comprising:
 a base sheet having an accomodation space sized for an integrated semiconductor circuit pellet;
 at least one integrated semiconductor circuit pellet having a plurality of electrode terminals and sealed in said accomodation space;
 an insulating film having a plurality of conductive leads, one end of each of which is opposed to one of said electrode terminals on the integrated semiconductor circuit pellet;
 an anisotropically conductive layer interposed between said integrated semiconductor circuit pellet and said insulating film electrically coupling said electrode terminals to said conductive leads, respectively.

3. An electronic memory card according to claim 2, wherein said anisotropically conductive layer is fixedly secured to each of said conductive leads including each of one end thereof and to inner side of said insulative film.

4. An electronic memory card according to claim 2, wherein a resin fills said accomodation space.

5. An electronic memory card according to claim 2, wherein said insulating film comprises a plurality of holes with input/output terminals received therein, respectively.

6. An electronic memory card according to claim 5, wherein said insulating film is transparent and includes a decorative layer visible therethrough on the inside of the card.

7. An electronic memory card according to claim 5, wherein said integrated semiconductor circuit pellet includes an Erasable and Programmable Read Only Memory.

8. An electronic memory card comprising:
 a base sheet having an accomodation space sized for an integrated semiconductor circuit pellet;
 at least one integrated semiconductor circuit pellet having a plurality of electrode terminals and seated in said accomodation space;
 an insulating film having a plurality of holes with input/output terminals received therein, respectively;
 a plurality of conductive leads, one end of each of which is connected to one of said electrode terminals on the integrated semiconductor circuit pellet and the other end of which is coupled to an input/output terminal at one end of said holes, said conductive leads being formed on at least one of said base sheet and said insulating film; and
 an anisotropically conductive layer interposed between said integrated semiconductor circuit pellet and said insulating film electrically coupling said electrode terminals to said conductive leads, respectively.

* * * * *